(12) United States Patent
Muramatsu

(10) Patent No.: US 6,287,915 B1
(45) Date of Patent: Sep. 11, 2001

(54) SEMICONDUCTOR DEVICE AND MANUFACTURING METHOD THEREFOR

(75) Inventor: Satoru Muramatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/196,417

(22) Filed: Nov. 19, 1998

(30) Foreign Application Priority Data

Nov. 19, 1997 (JP) .................................................... 9-317887

(51) Int. Cl.$^7$ ................................................ H01L 21/336
(52) U.S. Cl. ............................................................ 438/257
(58) Field of Search ................................... 438/201, 211, 438/257, 482, 486, 488, 593

(56) References Cited

U.S. PATENT DOCUMENTS

| | | | |
|---|---|---|---|
| 4,479,831 | * 10/1984 | Sandow et al. | 257/52 |
| 5,057,447 | * 10/1991 | Paterson | 438/252 |
| 5,060,195 | * 10/1991 | Gill et al. | 257/316 |
| 6,040,629 | * 3/2000 | Shimizu et al. | 257/317 |

FOREIGN PATENT DOCUMENTS

| | | | |
|---|---|---|---|
| 63-29954 | 2/1988 | (JP) | H01L/21/88 |
| 1244659 | 9/1989 | (JP) | H01L/27/04 |
| 33365 | 1/1991 | (JP) | H01L/29/62 |
| 629540 | 2/1994 | (JP) | H01L/29/788 |
| 7-66305 | 3/1995 | (JP) | H01L/21/8247 |
| 7-66509 | 3/1995 | (JP) | H01L/29/78 |
| 8-148584 | 6/1996 | (JP) | H01L/21/8247 |
| 8-167665 | 6/1996 | (JP) | H01L/21/8247 |
| 9-36263 | 2/1997 | (JP) | H01L/21/8247 |
| 9-246405 | 9/1997 | (JP) | H01L/21/8247 |
| 9-331042 | 12/1997 | (JP) | H01L/27/108 |
| 10-189778 | 7/1998 | (JP) | H01L/21/8247 |
| 10-275902 | 10/1998 | (JP) | H01L/27/108 |

OTHER PUBLICATIONS

Shirai, H., et al., "A 0.54 um2 Self–Aligned, HSG Floating Gate Cell . . . " IEDM 1995, pp. 653–656.*
Tatsunori, K. et al, "Initial Core Density Control in situ Phosphorous Doped Amorphous Silicon Evaluation" Spring 1995, Appl. Phys. Related United Lecture Meeting, No. 2 1995.
Muramatsu et al, "The Solution of Over–erase Problem Controlling Poly–Si Grain Size–Method Scaling Principles for FLASH Memory", IEEE, 1994, pp. 847–850.
"Two Dimensionally Inhomogeneous Structure at Gate Electrode/Gate Insulator Interface Causing Fowler–Nordheim Current Deviation in Nonvolatile Memory" Ushiyama et al ; 1991 IEEE/IRPS; pp. 331–336.
The SOlution of Over–Erase Problem Controlling Poly–Si Grain Size Modified Scaling Principles for Flash Memory: Muramatsu et al 1994 IEEE; IEDM; pp. 847–850.

* cited by examiner

*Primary Examiner*—Sara Crane
(74) *Attorney, Agent, or Firm*—Hayes, Soloway, Hennessey, Grossman & Hage, PC

(57) ABSTRACT

In a flash memory that has a floating gate that is formed by a polysilicon layer having grains, a gate electrode is formed on a gate oxide film that is provided on a semiconductor substrate, this gate electrode being formed as a multilayer structure by a polysilicon layer that has grains and at least one more polysilicon layer.

6 Claims, 5 Drawing Sheets

Fig. 3
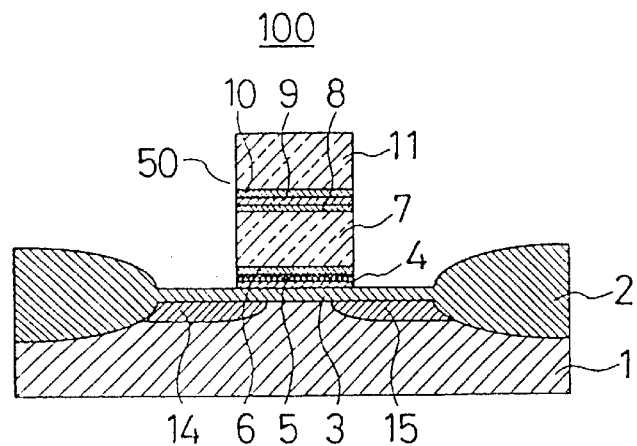
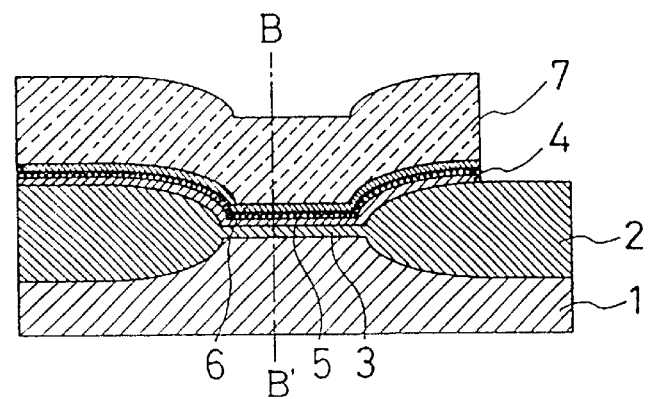
Fig. 4 (A)
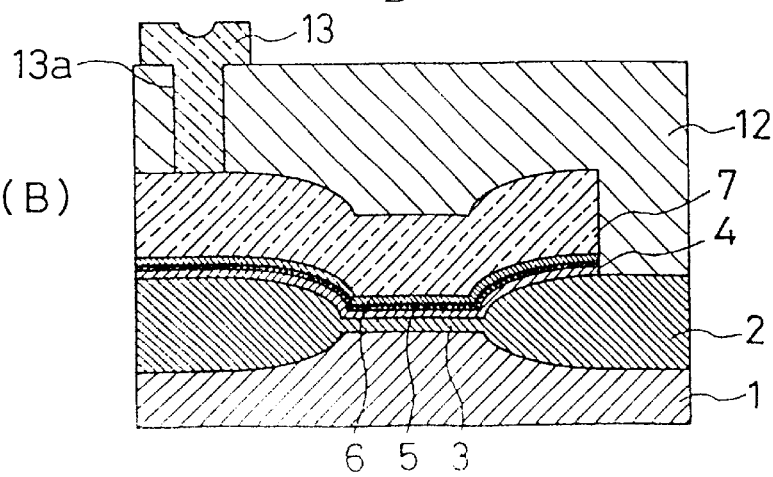
Fig. 4 (B)

SEMICONDUCTOR DEVICE AND MANUFACTURING METHOD THEREFOR

BACKGROUND OF THE INVENTION

1. Field of the Invention

The present invention relates to a MOS semiconductor device and a method of manufacturing a MOS semiconductor device, and more specifically it relates to a semiconductor device that is effective with respect to a non-volatile memory in which current is caused to flow between a gate electrode and a semiconductor substrate, and a method for manufacturing such a semiconductor device.

2. Background of the Invention

A great amount of research is being done with regard to the improvement of the storage capability of storage devices, and flash memories, which are non-volatile memories that, after having been written into, can be electrically erased, have come to gain attention in recent years.

A typical flash memory structure is one which has a floating gate electrode that is electrically insulated.

It is possible to induce an electrical charge into such a floating gate, and to hold this charge as stored data.

When writing or erasing this data, a voltage is applied between the source or the silicon substrate and a second gate electrode, and an electrical charge is either injected into the floating gate electrode or released therefrom.

For this reason, there is a need that the current flowing in the first gate oxide film be uniform over the entire cell array.

However, because of the heat that is applied to the floating gate, when forming the source and drain and when performing reflow of the interlayer insulation film, the crystal grains of the polysilicon grow, so that there is a large amount of n-type or p-type impurities existing at the grain boundary.

For this reason, a huge oxide ridge occurs at the boundary surface between the first gate oxide film and the second gate electrode, which is the floating gate (refer to page 331 of the preprints of IEEE/IRPS: International Reliability Physics Symposium, 1991), so that an excessive erase current flows during erasing when an electric charge is released from the floating gate, this resulting in faulty operation.

This in turn results in a reduction of the production yield of the flash memory.

In a resistive-load device such as an SRAM, a known technology for preventing a drop in the resistance value of the polysilicon of the resistance layer is that of using a three-layer construction in the polysilicon layer, consisting of a polysilicon layer/silicon oxide film layer/polysilicon layer structure (Japanese Unexamined Patent Publication (KOKAI) No. 1-244659).

In the above-noted prior art, let us consider whether or not the growth of the crystal grains in a polysilicon floating gate of a flash memory is prevented by the technology as described in the prior art.

Specifically, the structure is as shown in FIG. 6(B). As shown in FIG. 6(A), the manufacturing method in this case is that of forming a field oxide film 2 onto a p-type silicon substrate so that an element region is divided into islands, and forming a first gate oxide film 3 on a surface of an element region of the silicon substrate 1.

After forming the first gate oxide film 3, the CVD process is used to form a polysilicon film 4 to a thickness of approximately 70 nm, at which point the growth gas is switched to dry oxygen, so that a silicon oxide layer 6 is formed on the surface of the polysilicon film 4 to a thickness of 2 to 5 nm.

The growth gas is restored and a polysilicon layer 7 is formed on the silicon oxide layer 6 to a thickness of approximately 70 nm.

Next, after diffusing an impurity into the polysilicon film 7 to a concentration of, for example, $2 \times 10^{20}$ atoms/cc, photolithography and anisotropic etching are used to form the polysilicon film 4, the silicon oxide layer 6, and the polysilicon layer 7 as a three-layer first gate electrode.

Next, as shown in FIG. 6(B), the CVD process is used to deposit a lower-layer second gate oxide film 8 onto the polysilicon film 7 to a thickness of approximately 7 nm, and over this a nitride film 9 is formed to a thickness of approximately 5 nm, an upper-layer second gate oxide film 10 being formed to a thickness of approximately 7 nm on the surface which includes this nitride film 9.

By doing this, the first gate electrode, which is formed by the polysilicon layer 4, the silicon oxide 6, and the polysilicon layer 7 is formed as a floating gate.

Next, a polysilicon film 14 is formed to a thickness of approximately 150 nm as a second gate electrode 11 on the surface that includes the upper-layer second gate oxide film 10.

Then, on this second gate electrode 11, an interlayer insulation film 12 is formed to a thickness of approximately 500 nm, this interlayer insulation film having a contact hole formed in it by means of photolithography and anisotropic etching technologies, thereby forming a metal wire 13. By means of the above-noted process steps, a non-volatile memory is fabricated which has a first and a second gate electrode.

Another know prior art is that which is disclosed in the Japanese Unexamined Patent Publication (KOKAI) No. 6-29540, in which, as shown in FIG. 7, a field oxide film 44 that separates an element region on a p-type silicon substrate into islands is formed on a p-type silicon substrate 41, and a first gate oxide film 43 is formed on the surface of the element region of the silicon substrate 41.

After the first gate oxide film 43 is formed, the CVD process is used to form a polysilicon film 45 to a thickness of approximately 30 to 50 nm, at which point either $N_2$ annealing is done at a temperature in the range of 700° C. to 800° C., or the structure is left at room temperature for a short period of time, so as to form a silicon oxide film 46 to a thickness of approximately 2 to 3 nm on the surface of the polysilicon film 45.

A polysilicon layer 47 is formed to a thickness of approximately 100 to 150 nm on the surface of the silicon oxide layer 46. Next, after injecting an impurity to concentration of 1 to $8 \times 10^{14}$ atoms/cm$^2$ into this polysilicon layer 47, photolithography and anisotropic etching are used to form the polysilicon film 45, the silicon oxide film 46, and the polysilicon layer 47 as a three-layer first gate electrode.

Next, the CVD process is used to deposit a lower-layer second gate oxide film onto the polysilicon film 47 to a thickness of approximately 7 nm, and over this a nitride film is formed to a thickness of approximately 5 nm, an upper-layer second gate oxide film having a thickness of 7 nm, being formed over the surface which includes this nitride film.

By doing this, the first gate electrode, which is formed by a laminate of a polysilicon layer, a silicon oxide film layer, and a polysilicon layer, is formed as a floating gate.

Next, a polysilicon film is formed to a thickness of approximately 150 nm as a second gate electrode on the surface that includes the upper-layer second gate oxide film.

Then, onto this second gate electrode, an interlayer insulation film is formed to a thickness of approximately 500 nm, this interlayer insulation film having a contact hole formed in it by means of photolithography and anisotropic etching technologies, thereby forming a metal wire.

By means of the above-noted process steps, a non-volatile memory is fabricated which has a first and a second gate electrode.

In the first prior art described above, in a non-volatile MOS memory of the floating gate type, for example, because an impurity such as phosphor is diffused into the polysilicon layer, which is the first gate electrode, as is clear as well from the cited literature, the thermal processing for forming the diffusion layer and thermal processing for reflow of the interlayer insulation film in the process of fabricating the floating gate type non-volatile MOS memory diffuse the impurity via the crystal grains and reach the first gate oxide film.

Therefore, in the region of the crystal grains of the first gate oxide film, the impurity diffuses through the oxide film, causing a buildup of the first gate oxide film, the diffusion film enters into the first gate electrode, and the phenomenon of phosphor or other n-type impurity diffusing into the oxide film (oxide ridge formation) occurs.

Because of this phenomenon, when an electric charge is injected into or extracted from the floating gate of a floating gate non-volatile MOS memory of an electric charge, an excessive erase current occurs. This can cause faulty operation and a reduction in the production yield of floating gate type non-volatile MOS memories.

In the second example of prior art described above, in the case in which a floating gate type non-volatile MOS memory is fabricated using the technique of forming a three-layer structure of polysilicon layer/silicon oxide film/polysilicon layer as the polysilicon layer 48, it is possible to inhibit crystal grain growth, and it is possible to achieve a uniformly occurring oxide ridge and to somewhat reduce the failures related to excessive erasing.

However, because the purpose of the above-noted prior art is to prevent a reduction in the resistance value of the polysilicon, it has a feature the formation of a silicon oxide layer in the center part of the polysilicon layer.

For this reason, this prior art's effectiveness of inhibiting the occurrence of an oxide ridge at the boundary between the first gate oxide film and the first gate electrode by inhibiting crystal grain growth is small, and cannot be expected to achieve a great reduction in the excessive erase current.

According to this prior art, there does exist the possibility that, in the case of using a three-layer floating gate structure of polysilicon layer/silicon oxide film/polysilicon layer, there will be an inhibition of the growth of crystal grains and a reduction in excessive erase current.

However, as the density of flash memories increase, at 16 Mbits and beyond, it become necessary to have polysilicon with a crystal grain size of 50 nm or smaller (refer to page 847, IEEE/IEDM '94 Technical Digest, 1994).

Because in the second cited example of prior art the growth of the lower-layer of the floating gate is polysilicon growth, even if control is performed of the thermal processing and amount of impurities, the grain size will be 50 nm or larger.

Thus, the inhibition of an excessive erase current in the second cited prior art will not achieve a great effect of improvement for levels of integration of flash memories of 16 Mbits or greater.

Accordingly, an object of the present invention is to achieve an improvement with respect to the drawbacks of the prior art as cited above, by providing a semiconductor device having a gate electrode that is formed by a polysilicon layer having a crystal grain size of no greater than 50 nm, and in particular a flash memory having such as gate electrode which, at a level of integration of 16 Mbits or greater, provides a reduction in the frequency of occurrence of excessive erasing failures, and a method of manufacturing the above-noted semiconductor device.

SUMMARY OF THE INVENTION

To achieve the above-noted object, the present invention has the following basic technical constitution.

Specifically, the first aspect of the present invention is a non-volatile MOS semiconductor device having a gate electrode on a gate oxide film that is provided on a semiconductor substrate, the gate electrode of this semiconductor device being a multilayer structure that is made of a polysilicon layer having grains and at least one more polysilicon layer.

The second aspect of the present invention being a method of manufacturing a non-volatile MOS semiconductor device having a gate electrode on a gate oxide film that is provided on a semiconductor substrate, this method having a first step of forming a gate oxide film on a semiconductor substrate, a second step of forming an amorphous silicon layer on top of the above-noted gate oxide film, a third step of forming a polysilicon layer having grains on top of the above-noted amorphous silicon layer, and a fourth step of forming a polysilicon layer over the above-noted polysilicon layer that has grains.

A third aspect of the present invention is a method of manufacturing a non-volatile MOS semiconductor device having a gate electrode on a gate oxide film that is provided on a semiconductor substrate, this method having a first step of forming a gate oxide film on a semiconductor substrate, a second step of forming an amorphous silicon layer on top of the above-noted gate oxide film, a third step of forming a polysilicon layer having grains on top of the above-noted amorphous silicon layer, a fourth step of forming an oxide film or a nitride film over the above-noted polysilicon layer that has grains, and a fifth step of forming a polysilicon layer over the above-noted oxide or nitride film.

By virtue of the above-described technical constitutions, in a semiconductor that has a gate electrode that is formed over a gate oxide film on a semiconductor substrate, the present invention is a semiconductor device in which the above-noted gate electrode includes a polysilicon layer having a small crystal grain size and another polysilicon layer or additionally a thinner oxide layer, and is also a method of manufacturing this semiconductor device.

BRIEF DESCRIPTION OF THE DRAWINGS

FIG. 3 is a cross-sectional view that shows an example of the configuration of a semiconductor according to the present invention.

FIG. 4 (FIGS. 4(A) 4(B)) is a cross-sectional view that shows another specific example of a method of manufacturing a semiconductor according to the present invention.

DESCRIPTION OF THE PREFERRED EMBODIMENTS

Figure 1A:
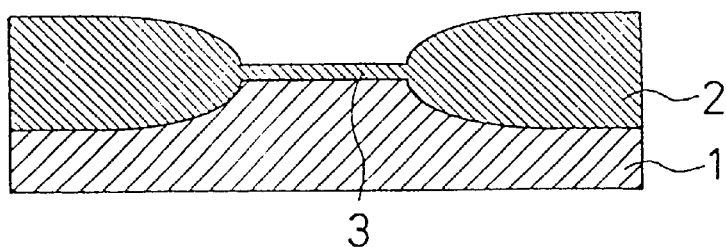
FIG. 1 (FIGS. 1(A)–1(E)) is a cross-sectional view that shows an example of a method of manufacturing a semiconductor device according to the present invention.
Figure 1B:
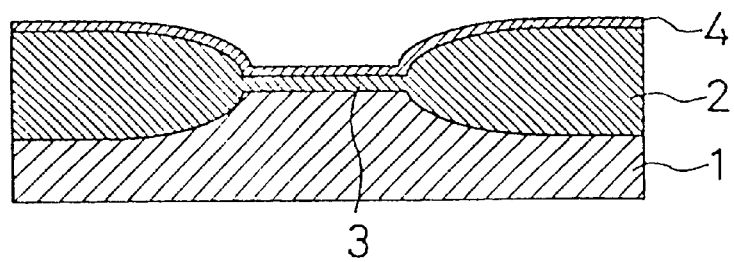
Figure 1C:
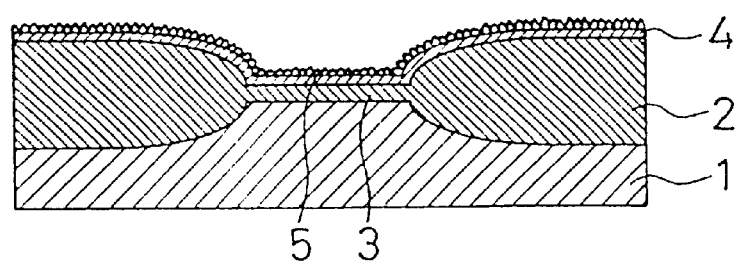
Figure 1D:
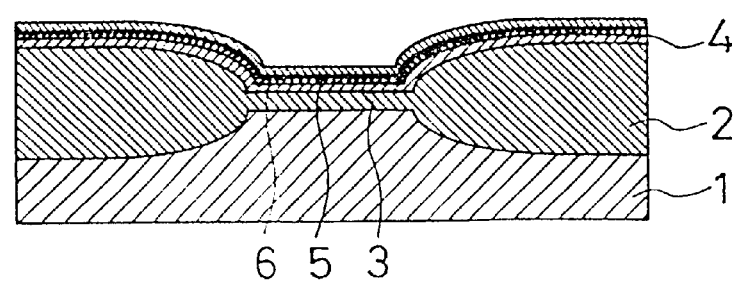

Preferred embodiments of a semiconductor device and method of manufacturing same according to the present invention will be described in detail below, with reference made to relevant accompanying drawings.

FIG. 2 and FIG. 3 are cross-section views that show an example of the configuration of a semiconductor device according to the present invention. These drawings shows a semiconductor device 100 in which a gate electrode 50 is disposed on top of a gate oxide film 3 that is provided on top of a semiconductor substrate 1, wherein the gate electrode 50 is formed by a polysilicon layer 5 that has grains and by at least one more layer of polysilicon 7.

In the semiconductor device 100, it is desirable that the crystal grain size be 50 nm or smaller, and it is also desirable that at least the silicon layer that is connected to the gate oxide film 3 be an amorphous silicon layer 4.

Additionally, in a specific example of the present invention, the gate electrode 50 has a three-layer structure that is formed, starting at the gate oxide film 3, by the amorphous silicon layer 4, the polysilicon layer 5 having grains, and the polysilicon layer 7, in this sequence, and in another example of the present invention, the gate electrode 50 is a four-layer structure form, starting at the gate oxide film 3, by the amorphous silicon layer 4, the polysilicon 5 having grains, an oxide film 6, and a polysilicon layer 7, in this sequence.

Additionally, the gate electrode 50 of the present invention is preferably used in a semiconductor which serves as a flash memory, in which case it is desirable that this forms a floating electrode.

An example of the method of manufacturing a semiconductor device according to the present invention is described below, with reference being made to the drawings FIG. 1(A) through FIG. 1(E) and FIG. 2(A) through FIG. 2(D).

Specifically, in this example of the present invention the process for manufacturing this device as a floating gate type non-volatile MOS memory in particular is described in terms of cross-sectional views, although it is obvious that the present invention is not restricted to this embodiment.

FIG. 2 is a cross-sectional view that is seen from a direction that is perpendicular to the orientation of the cross-sectional view of FIG. 1.

In the first embodiment of the present invention, as shown in FIG. 1, a field insulation film 2 for the purpose of element separation is selectively formed onto a main surface of a semiconductor substrate 1, thereby dividing an element forming region.

Next, an oxidation method is used to provide a gate oxide film 3 on a surface of the above-noted element region. Next, either a doping or non-doping method is used to form an amorphous silicon film 4 by a CVD process onto a surface that includes the gate oxide film 3, this being deposited to a thickness of approximately 1 to 50 nm.

Next, after removing the natural oxide film from the top of the amorphous silicon layer 4, annealing or seeding is done in a high vacuum, so as to form the seeds 5 of hemispherical polysilicon grains onto the amorphous silicon layer 4.

At this point, in the annealing step seeds will be formed by heating the silicon substrate to a temperature of 600° C. or higher. In the heating step, the silicon wafer is maintained at a temperature of no greater than 600° C., and exposure is made to silane or disilane gas using a CVD process to seed the hemispherical polysilicon onto the amorphous silicon layer 4, after which annealing is done at 600° C. to 700° C.

By means of the above-noted methods, a HSG (hemispherical grain) silicon layer 5 having protrusions and depressions is formed on the amorphous silicon layer 4 by means of the seeds. (In the description that follows, the above-noted polysilicon layer with grains will be referred to as an HSG layer.) Next, a silicon oxide layer 6 is formed on the HSG layer 5 to a thickness of approximately 1 to 3 nm. Although the effect of the present invention is obtained even if this silicon oxide layer 6 is not formed, the effect of this silicon oxide layer 6 is to further inhibit the growth of grains in the polysilicon, thereby enabling the formation of smaller grains. The same type of effect is obtained if this silicon oxide layer 6 is replaced by a silicon nitride layer.

Next, a polysilicon layer 7 is deposited on top of either this silicon oxide layer 6 or the HSG layer 5.

A floating gate is formed either by the four-layer structure of the amorphous layer 4, the HSG layer 5, the silicon oxide layer 6 and the polysilicon layer 7, or by the three-layer structure of the amorphous silicon layer 4, the HSG layer 5, and the polysilicon layer 7.

Next, an n-type impurity such as phosphor is diffused into the polysilicon layer 7 to a concentration of approximately $2 \times 10^{20}$ atoms/cc, after which photolithography and anisotropic etching technologies are used to selectively and sequentially etch the polysilicon layer 7, the silicon oxide layer 6, the HSG layer 5, and the amorphous silicon layer 4, thereby forming a floating electrode that is formed by the polysilicon layer 7, the silicon oxide layer 6, the HSG layer 5, and the amorphous silicon layer 4.

Then, a CVD process is used to deposit a lower-layer gate oxide film 8 on the surface that includes the polysilicon layer 7, a nitride film 9 is formed thereover, and an upper-layer second gate oxide film 10 is then deposited on the surface that includes this nitride film 9.

Figure 2A:
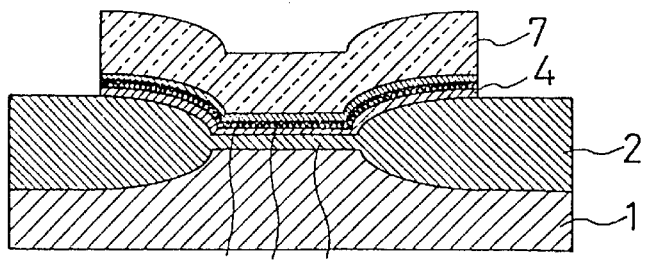
FIG. 2 (FIGS. 2(A)–2(D)) is a cross-sectional view that shows an example of a method of manufacturing a semiconductor device according to the present invention.
Figure 2B:
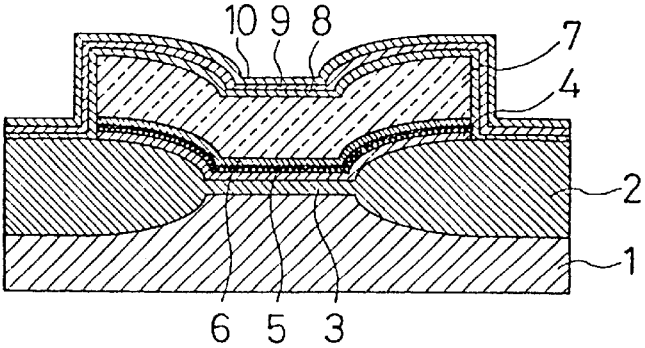
Figure 2C:
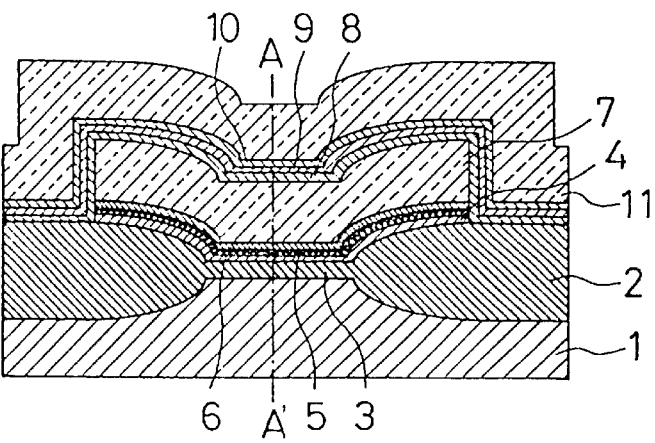
Figure 2D:
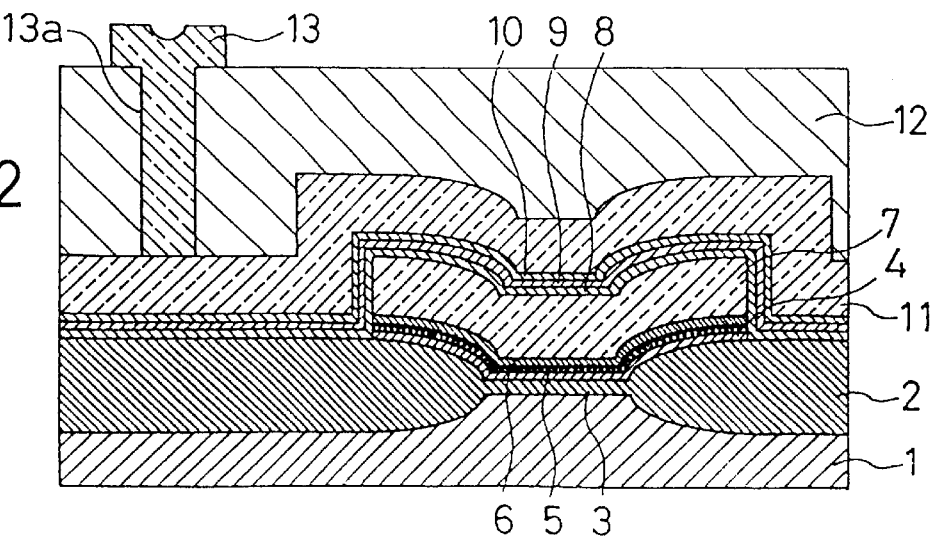

Next, a polysilicon layer is deposited as a second gate electrode on the surface that includes this upper-layer second gate oxide film 10, after which an n-type impurity such as phosphor is diffused into the second gate electrode 11 to a concentration of approximately $6 \times 10^{20}$ atoms/cc and, as shown in FIG. 3, photolithography and anisotropic etching technologies are used to form the second gate electrode 11 and the first gate electrode 50, which is formed by the amorphous silicon layer 4, the HSG layer 5, the silicon oxide layer 6, and the polysilicon layer 7. FIG. 3 is a cross-sectional view along the cutting line A—A that is shown in FIG. 2(C).

Then, by injecting an impurity such as arsenic into the silicon substrate 1, the source and drain regions 14 and 15 are formed. The interlayer insulation film 12 that includes the second gate electrode is then formed, a contact hole 13a being then formed on this interlayer insulation film 12 by using photolithography and anisotropic etching technologies, thereby forming the metal wire 13.

The above process steps produce a non-volatile memory that has a first and a second gate electrode.

In this embodiment of the present invention, by forming an HSG layer in the region of the gate insulation boundary of the lower-layer gate electrode, it is possible to form small crystal grains of approximately 20 nm and, by so doing, it is possible to reduce the excessive erasing failures at levels of integration of 16 Mbits and beyond.

In this embodiment of the present invention, in the case in which the silicon oxide layer 6 is formed, because there is inhibition of crystal grain growth caused by thermal processing when forming a diffusion layer and thermal processing when performing reflow of the interlayer insulation film in the process of manufacturing a floating gate type nonvolatile MOS memory, it is possible to obtain even smaller crystal grains, and this silicon oxide layer 6 becomes a location for segregated deposition of an n-type impurity such as phosphor, thereby serving to inhibit diffusion.

Essentially, by forming a silicon oxide layer, the diffusion of an n-type impurity such as phosphor into the gate oxide film 3 is inhibited, this enabling the inhibition of an excessive erase current at an oxide ridge, and by using this in combination with making the crystal grain size small, it is possible to even further inhibit the occurrence of excessive erase current.

In this embodiment of the present invention, even if the silicon oxide is replaced by a nitride film or the like, because of the inhibition of crystal grain growth and inhibition of n-type impurity diffusion, the same type of effect can be expected.

The second embodiment of a semiconductor device 100 according to the present invention is described below, with reference made to FIG. 4 and FIG. 5.

Figure 1E:
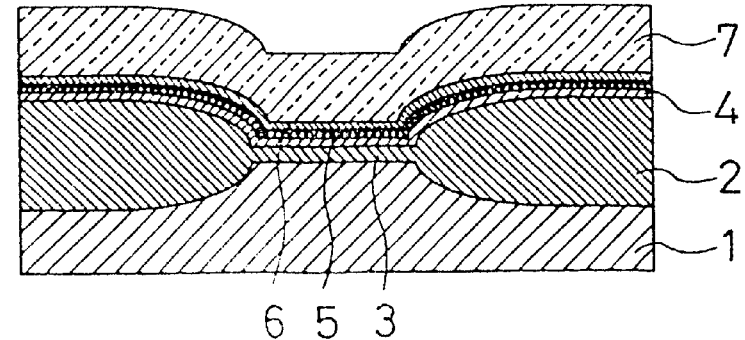

Specifically, the basic manufacturing process steps in this second embodiment are substantially the same as described with regard to the first embodiment, as illustrated by FIG. 1(A) through FIG. 1(E), and after the semiconductor device is formed shown in FIG. 1(E), the process steps illustrated in FIG. 4(A) and FIG. 4(B) are performed.

Figure 5:
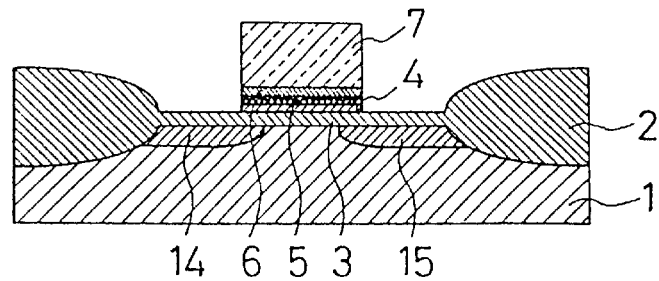
FIG. 5 is a cross-sectional view that shows another example of the configuration of a semiconductor according to the present invention.
Figure 6A:
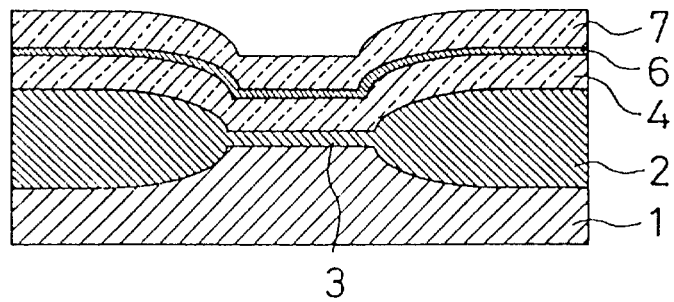
FIG. 6 (FIGS. 6(A)–6(B)) is a cross-sectional view that shows an example of a semiconductor device according to the prior art.
Figure 6B:
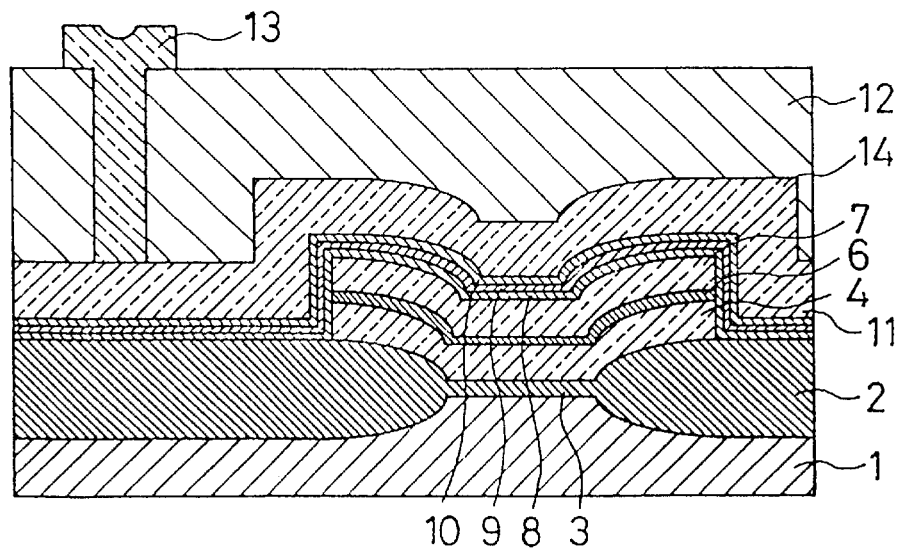
Figure 7:
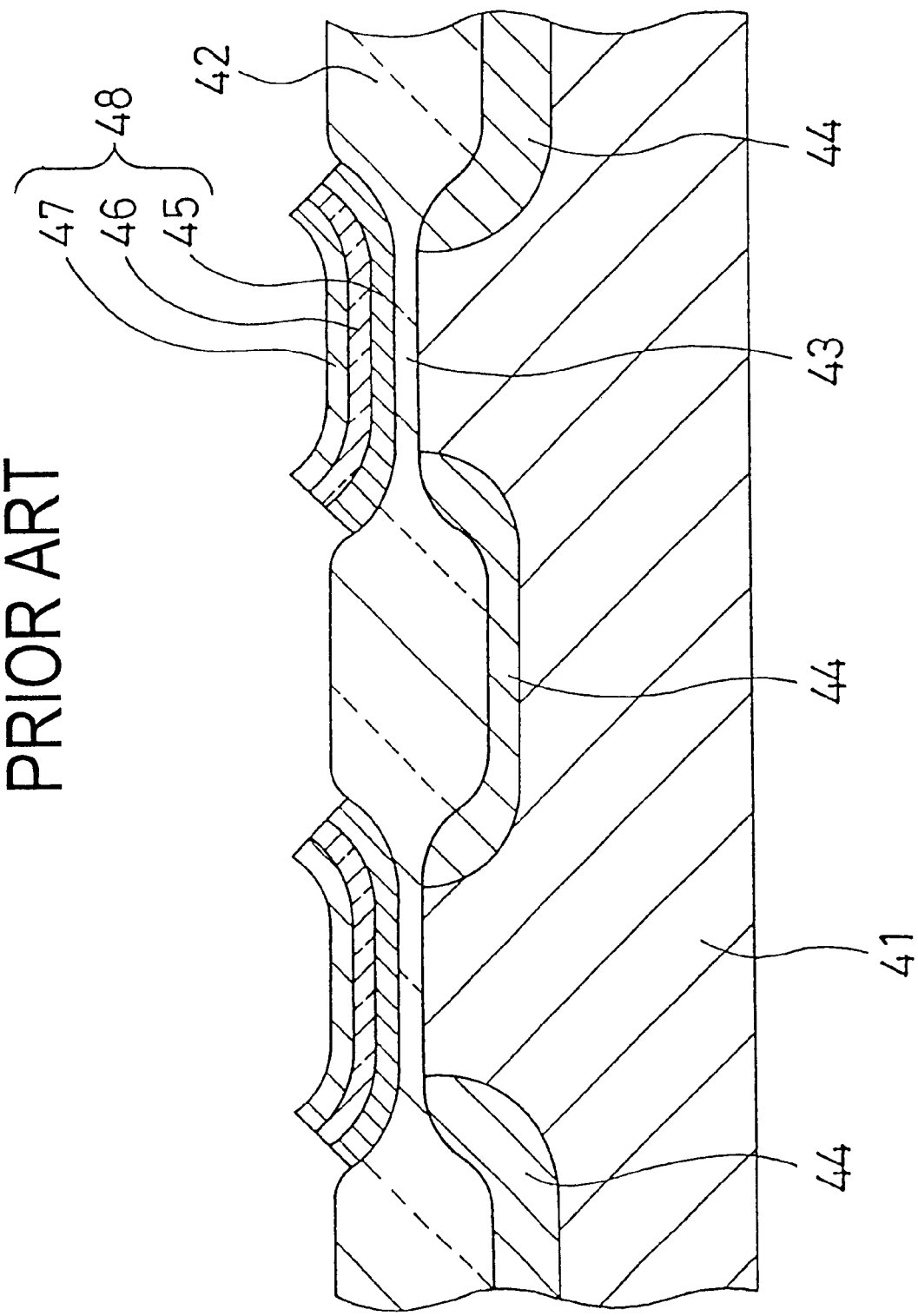
FIG. 7 is a cross-sectional view that shows another example of a semiconductor device according to the prior art.

FIG. 5 is a cross-sectional view along the cutting line B—B that is shown in FIG. 4(A).

More specifically, as shown in FIG. 1(A) through FIG. 1(E) with regard to the first embodiment, a field insulation film 2 for the purpose of element separation is selectively formed on a main surface of a semiconductor substrate 1, thereby dividing an element forming region. Next, an oxidation method is used to provide a gate oxide film 3 on a surface of the element region.

Next, either a doping or a non-doping method is used to form an amorphous silicon film 4 by a CVD process onto a surface that includes the gate oxide film 3, this being deposited to a thickness of approximately 1 to 50 nm.

Next, as is done in the case of the first embodiment, after removing the natural oxide film from the top of the amorphous silicon layer 4, annealing or seeding is done in a high vacuum, so as to form seeds of hemispherical silicon crystal grains on the amorphous silicon layer 4, thereby forming the polysilicon layer 5 having grains. If necessary, a silicon oxide film having a thickness of approximately 1 to 3 nm is formed on top of the HSG layer 5.

Next, a polysilicon layer 7 is deposited on top of the silicon oxide film 6 or the HSG layer 5. A floating gate is formed either by the four-layer structure of the amorphous layer 4, the HSG layer 5, the silicon oxide layer 6 and the polysilicon layer 7, or by the three-layer structure of the amorphous silicon layer 4, the HSG layer 5, and the polysilicon layer 7.

Next, after diffusing a n-type impurity such as phosphor into the polysilicon layer 7 to a concentration of approximately $2 \times 10^{20}$ atoms/cc, photolithography and anisotropic etching technologies are used to selectively etch the polysilicon layer 7, the silicon oxide layer 6, the HSG layer 5, and the amorphous silicon layer 4, thereby forming a gate electrode 50 that is made up of the polysilicon layer 7, the silicon oxide layer 6, the HSG layer 5, and the amorphous silicon layer 4.

Then, as shown in FIG. 5, photolithography and anisotropic etching technologies are used to form the first gate electrode 50, which is formed by the polysilicon layer 4, the HSG layer 5, the silicon oxide layer 6, and the polysilicon layer 7.

Then, by injection of an impurity such as arsenic into the silicon substrate 1, the source and drain regions 14 and 15 are formed. The interlayer insulation film 12 that includes the first gate electrode is then formed, a contact hole being then formed on this interlayer insulation film 12 by using photolithography and anisotropic etching technologies, thereby forming the metal wire 13. The above process steps produce memory having an MOS structure.

Essentially, the inhibition of the occurrence of an oxide ridge in the present invention is effective not only with regard to excessive erasing in a flash memory, but also can be expected to achieve the effect of reducing the leakage current in general MOS memories.

That is, as the level of integration of general MOS memories increases, the thickness of the gate oxide film has decreased, bringing with it an increase in the electric field that is applied to the gate oxide film.

This means that the occurrence of an oxide ridge causes an increase in the current that passes through the gate oxide film, making it necessary to reduce the leaking current.

To achieve this, even in a case such as shown with regard to the second embodiment of the present invention, in which the method of forming a floating gate of the first embodiment is applied to a general MOS memory, because, similar to the case of the first embodiment, it is possible to inhibit the leakage current from the gate electrode that flows via the gate oxide film in the general MOS memory device.

By virtue of the technical constitution as described above, a semiconductor device according to the present invention reduces the crystal grain size and causes the uniform occurrence of an oxide edge in a region in which an erase current flows, thereby eliminating variations between bits.

Additionally, because the crystal grain diameter is made small, the segregated deposition of an n-type impurity such a phosphor at a gain boundary is distributed due to an increase in the number of segregation sites.

This in turn enables the inhibition of diffusion of the n-type impurity such as phosphor into the gate oxide film 3, thereby inhibiting the occurrence of an excessive erase current.

As a result, in the present invention, in which the floating gate structure is a three-layer structure formed by the amorphous silicon layer 4, the HSG layer 5, the silicon oxide layer 6 or silicon nitride film, and the polysilicon layer 7 or a structure of four or more layers formed by the repetition of the above-noted layers, the gain size of the lower-layer gate electrode is made small, thereby enabling the reduction of excessive erasing failures.

Additionally, the present invention can be expected to achieve the effect of reducing the leakage current in the case of a general MOS memory as well. As the level of integration of general MOS memories increases, the thickness of the gate oxide film has decreased, bringing with it an increase in the electric field that is applied to the gate oxide film.

The occurrence of an oxide ridge under this circumstance causes an increase in the current that passes through the gate oxide film, making it necessary to reduce the leakage current. If the present invention is applied to the gate electrode in a general MOS memory, it is possible to inhibit the leakage current that passes from the gate electrode via the gate oxide film.

What is claimed is:

1. A method of manufacturing an MOS semiconductor device having a gate electrode on top of a gate oxide film layer that is provided on a semiconductor substrate, said method comprising:

a first step of forming a gate oxide film on said semiconductor substrate;

a second step of forming an amorphous silicon layer on top of said gate oxide film;

a third step of forming a polysilicon layer having silicon crystal grains on top of said amorphous silicon layer; and a fourth step of forming a polysilicon layer over said polysilicon layer that has grains.

2. A method of manufacturing a MOS semiconductor device having a gate electrode on top of a gate oxide film layer that is provided on a semiconductor substrate, said method comprising:

a first step of forming a gate oxide film on said semiconductor substrate;

a second step of forming an amorphous silicon layer on top of said gate oxide film;

a third step of forming a polysilicon layer having silicon crystal grains on top of said amorphous silicon layer;

a fourth step of forming either an oxide film or a nitride film on said polysilicon layer having grains; and a fifth step of forming a polysilicon layer over said oxide film layer or nitride film layer.

3. A method of manufacturing a semiconductor device according to claim 1, wherein said third step is one whereby said amorphous silicon layer, having been formed by said second step, is annealed in a high vacuum.

4. A method of manufacturing a semiconductor device according to claim 2, wherein said third step is one whereby said amorphous silicon layer, having been formed by said second step, is annealed in a high vacuum.

5. A method of manufacturing a semiconductor device according to claim 1, wherein said third step is one whereby said amorphous silicon layer, having been formed by said second step, is processed with silane gas or with disilane gas at a high temperature.

6. A method of manufacturing a semiconductor device according to claim 2, wherein said third step is one whereby said amorphous silicon layer, having been formed by said second step, is processed with silane gas or with disilane gas at a high temperature.

* * * * *